United States Patent
Kuppusamy et al.

(10) Patent No.: US 7,432,773 B2
(45) Date of Patent: Oct. 7, 2008

(54) METHOD, SYSTEM AND APPARATUS FOR REDUCING OSCILLATOR FREQUENCY SPIKING DURING OSCILLATOR FREQUENCY ADJUSTMENT

(75) Inventors: Vanitha Kuppusamy, Chandler, AZ (US); Clark Rogers, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 80 days.

(21) Appl. No.: 11/531,004

(22) Filed: Sep. 12, 2006

(65) Prior Publication Data

US 2007/0090884 A1    Apr. 26, 2007

Related U.S. Application Data

(60) Provisional application No. 60/730,314, filed on Oct. 26, 2005.

(51) Int. Cl.
*H03L 7/099* (2006.01)
(52) U.S. Cl. .................... 331/185; 331/177 R
(58) Field of Classification Search ........... 331/185, 331/177 R
See application file for complete search history.

(56) References Cited

U.S. PATENT DOCUMENTS 6,114,920 A    9/2000    Moon et al.

6,313,707 B1 *  11/2001   Fischer et al. ............. 331/17

FOREIGN PATENT DOCUMENTS

| EP | 0 460 651 A2 | 11/1999 |
| EP | 1 643 651 A1 | 5/2006 |

OTHER PUBLICATIONS

Howard C. Yang et al; "A Low Jitter 0.3-165 MHz CMOS PLL Frequency Synthesizer for 3 V/5 V Operation"; IEEE Journal of Solid-State Circuits, IEEE Service Center, Piscataway, NJ, US, vol. 32, No. 4, Apr. 1997.
International Search Report for PCT/US2006/041585 Mailed Apr. 12, 2007.

* cited by examiner

*Primary Examiner*—Joseph Chang
(74) *Attorney, Agent, or Firm*—Baker Botts L.L.P.

(57) ABSTRACT

Current sources are selectively coupled to a current controlled frequency determining circuit of an oscillator. A buffer amplifier has an input coupled to the current controlled frequency determining circuit of the oscillator and the buffer amplifier output is selectively coupled to the current sources not coupled to the frequency determining circuit of the oscillator. The buffer amplifier output maintains substantially the voltage of the current controlled frequency determining circuit on each of the current sources not coupled to the frequency determining circuit so that when any current source is coupled thereto, there is substantially no voltage difference therebetween. This substantially prevents generation of undesirable frequency spikes during coupling of the current sources to the frequency determining circuit of the oscillator.

18 Claims, 3 Drawing Sheets

METHOD, SYSTEM AND APPARATUS FOR REDUCING OSCILLATOR FREQUENCY SPIKING DURING OSCILLATOR FREQUENCY ADJUSTMENT

RELATED PATENT APPLICATION

This application claims priority to commonly owned U.S. Provisional Patent Application Ser. No. 60/730,314; filed Oct. 26, 2005; entitled "Method, System and Apparatus for Reducing Oscillator Frequency Spiking During Oscillator Frequency Adjustment" by Vanitha Kuppusamy and Clark Rogers, and is hereby incorporated by reference herein for all purposes.

TECHNICAL FIELD

The present disclosure relates to oscillator frequency adjustment, and more particularly, to reducing oscillator frequency spiking during the oscillator frequency adjustment.

BACKGROUND

Frequency "dithering" or "spreading" may be used to reduce peak emitted radiation at any one frequency during electromagnetic interference (EMI) testing and certification of electronic equipment. Dithering may spread the center frequency of clocks used in digital systems, e.g., computers, and/or power supplies for spreading radiated emission energy over a band of frequencies, rather then having all of the emission energy at only one frequency. Thus by spreading the emitted frequency over a band of frequencies, the radio frequency energy at any one frequency may be reduced over a EMI testing time period. Frequency dithering may be accomplished by switching a fundamental frequency, f, between f+f1 and f−f1, where f1 may be a small delta frequency or frequencies.

In dithering the frequency of an oscillator may be shifted from one preset frequency to another preset frequency by changing control bits in a frequency control register. The control bits may control changing of bias currents of the frequency determining circuits of the oscillator. However when abruptly changing these bias currents in the frequency determining circuits of the oscillator, the frequency may shift by more than 300% for a short time duration, e.g., one microsecond, before settling to its final frequency value. Loop response of a phase-locked-loop (PLL) may be fast enough to detect this undesired frequency excursion (frequency glitch) and may propagate it further to a system clock. This may create undesirable effects in the radiated emission (EMI) when used, for example, in switched mode power supply applications.

SUMMARY

Therefore there is a need for changing a frequency on the fly by changing the bias currents controlling the frequency of an oscillator circuit without causing the frequency of the oscillator circuit to overshoot undesirably. According to this disclosure, by using a buffer amplifier having an input coupled to a current input node of the oscillator circuit and switches that couple the output of the buffer amplifier to unconnected bias current source nodes (not yet connected to the current input node of the oscillator circuit), each unconnected bias current source node is forced to have substantially the same voltage value as the current input node of the oscillator. Since the current input node of the oscillator circuit is voltage sensitive, any abrupt voltage change on this node may result in generation of undesirable frequency overshoot during frequency switching operations, e.g., frequency dithering increments. Thus, by substantially equalizing the voltages at all of the unconnected bias current source nodes with the voltage at the current input node of the oscillator any frequency overshoot caused by voltage spikes may be significantly reduced.

According to a specific example embodiment of this disclosure, a current controlled variable frequency oscillator may comprise: an oscillator having a frequency determining circuit that changes frequency with changes in current thereto; a plurality of current sources; a plurality of first switches, each of the plurality of first switching when selected couples a respective one of the plurality of current sources to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto; a plurality of second switches; and a buffer amplifier connected as a non-inverting amplifier and having a gain of substantially one, wherein an input of the buffer amplifier is coupled to the frequency determining circuit of the oscillator, and an output of the buffer amplifier is coupled to the plurality of second switches; wherein each of the plurality of second switches is coupled to a respective one of the current sources and couples the output of the buffer amplifier to the respective current source when the respective current source is not coupled to the frequency determining circuit of the oscillator through a respective selected one of the plurality of first switches such that each one of the plurality of current sources is at substantially the same voltage level as the frequency determining circuit.

According to another specific example embodiment of this disclosure, a method of controlling a variable frequency oscillator may comprise: generating a clock signal with an oscillator having a frequency determining circuit controlled by an amount of current coupled thereto; providing a plurality of current sources, each of the plurality of current sources is adapted to supply a respective amount of current; providing a plurality of first switches, wherein when each of the plurality of first switching is selected a respective one of the plurality of current sources is coupled to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto; providing a plurality of second switches; and providing a buffer amplifier connected as a non-inverting amplifier and having a gain of substantially one; coupling an input of the buffer amplifier to the frequency determining circuit of the oscillator; and coupling an output of the buffer amplifier to the plurality of second switches, wherein each of the plurality of second switches couples a respective one of the current sources to the output of the buffer amplifier when the respective current source is not coupled to the frequency determining circuit of the oscillator through a respective selected one of the plurality of first switches such that each one of the plurality of current sources is at substantially the same voltage level as the frequency determining circuit.

According to yet another specific example embodiment of this disclosure, a digital system having a current controlled variable frequency clock oscillator may comprise: a digital device having a clock input; an oscillator having a frequency determining circuit that changes frequency with changes in current thereto, and an output coupled to the clock input of the digital device; a plurality of current sources; a plurality of first switches, each of the plurality of first switching when selected couples a respective one of the plurality of current sources to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto; a plurality of second switches; and a buffer amplifier connected as a non-inverting amplifier and having a gain of substantially one, wherein an input of the buffer amplifier is coupled to the frequency determining circuit of the oscillator, and an output of the buffer amplifier is coupled to the plurality of second switches; wherein each of the plurality of second switches is coupled to a respective one of the current sources and couples the output of the buffer amplifier to the respective current source when the respective current source is not coupled to the frequency determining circuit of the oscillator through a respective selected one of the plurality of first switches such that each one of the plurality of current sources is at substantially the same voltage level as the frequency determining circuit.

BRIEF DESCRIPTION OF THE DRAWINGS

A more complete understanding of the present disclosure thereof may be acquired by referring to the following description taken in conjunction with the accompanying drawings wherein.

Figure 1:
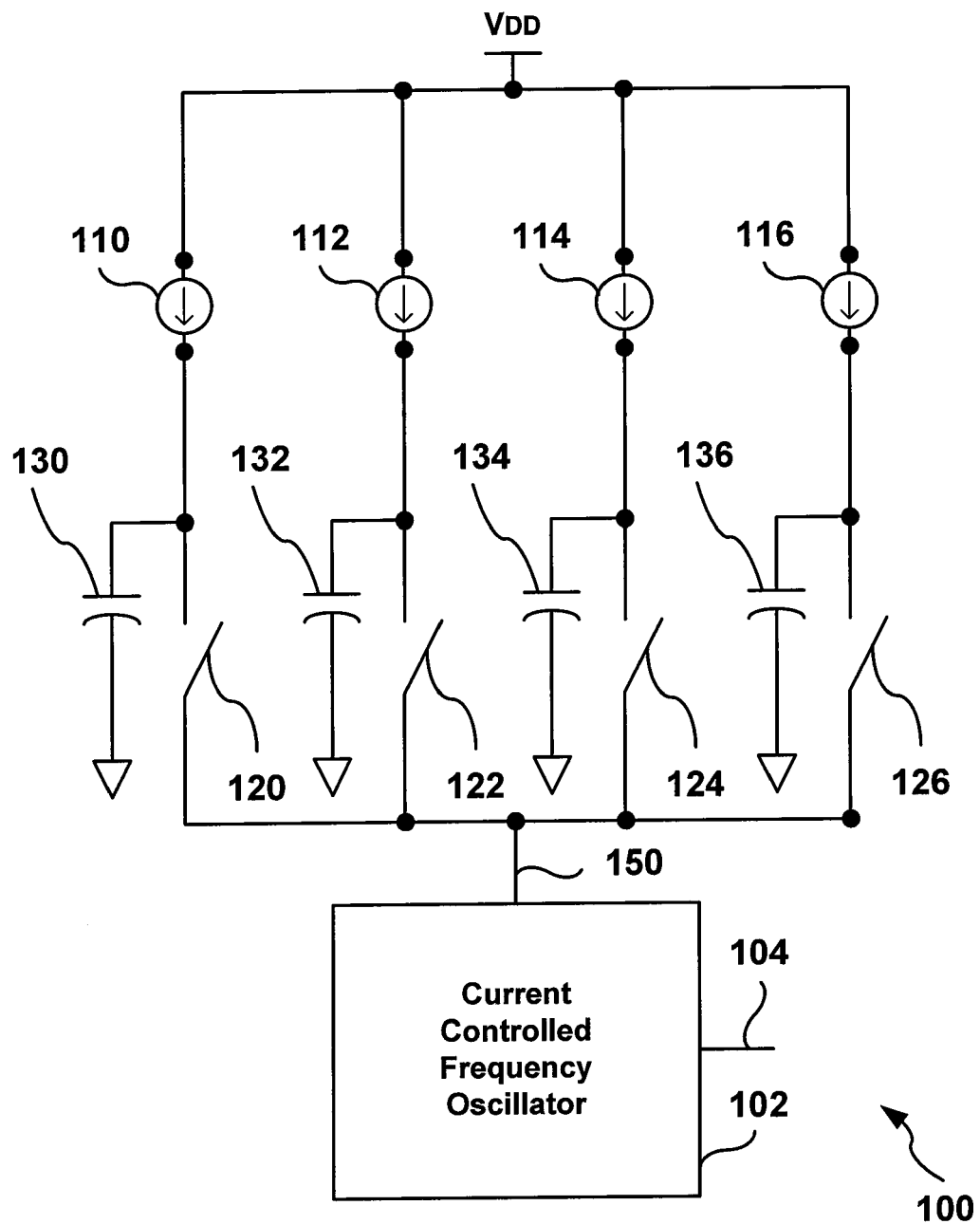
FIG. 1 illustrates a schematic functional diagram of an oscillator having bias current legs that control the frequency of oscillation in combination with the parasitic capacitors that are present in the devices used to construct the current legs.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic functional diagram of an oscillator having bias current legs that control the frequency of oscillation in combination with the parasitic capacitors that are present in the devices used to construct the current legs. By switching in and out these bias legs with their associated parasitic capacitors the frequency may be changed, for example, in steps of from about +/−0.375 percent to about +/−3 percent. This enables an implementation of an on-chip circuit for dithering of the output frequency that may be used in reducing the radiated emissions energy in switched mode power supply applications. An oscillator, generally represented by the numeral 100, may comprise a current controlled frequency oscillator circuit 102, a plurality of bias current sources 110, 112, 114 and 116, and a plurality of switches 120, 122, 124 and 126. The current controlled frequency oscillator circuit 102 may produce a clock output 104. The frequency of oscillation (e.g., frequency of the clock output 104) of the oscillator 100 may be determined by the amount of current applied to the current controlled frequency oscillator circuit 102 from any one or combination of the bias current sources 110, 112, 114 and/or 116. The switches, e.g., MOSFET switches, 120, 122, 124 and 126 may connect/disconnect the bias current sources 110, 112, 114 and 116, respectively, to/from the current controlled frequency oscillator circuit 102.

Each of the bias current sources 110, 112, 114 and 116 may have associated parasitic capacitors 130, 132, 134 and 136, respectively, created from, for example, the gate-drain capacitance of each transistor making up a respective bias current source. These parasitic capacitors may charge to a higher voltage, e.g., $V_{DD}$, than the node 150 whenever the respective switches 120, 122, 124 and/or 126 are switched off. During dithering when one or more of the switches 120, 122, 124 and/or 126 are turned on (conduct), the difference in voltage potential on either side of the switch that is about to be turned on may cause a current spike which will translate into a greater change in frequency than desired for a short period of time. This short current spike may create an undesirable frequency glitch when switching between the normally selected frequencies of the oscillator 100 during frequency dithering.

Figure 2:
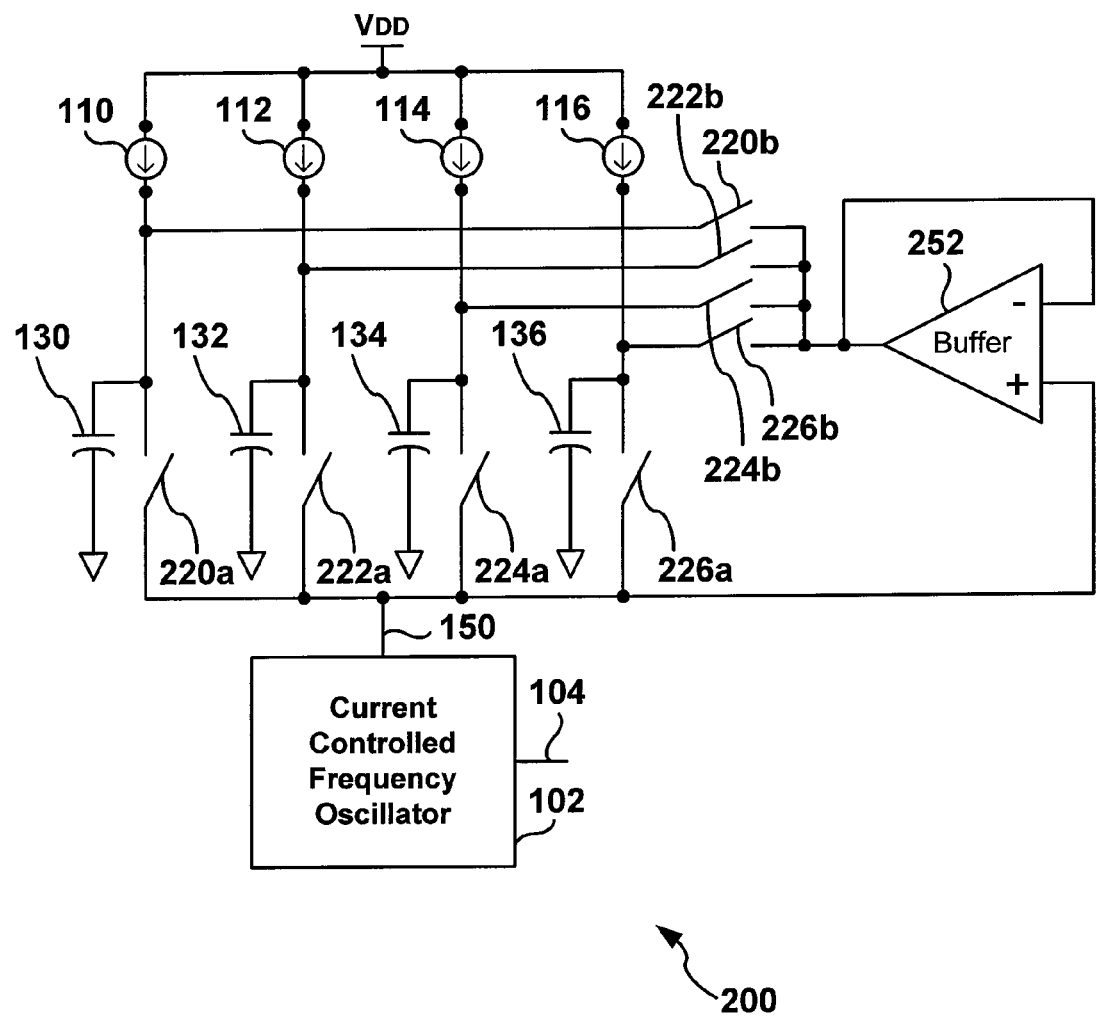
FIG. 2 illustrates a schematic functional diagram of an oscillator having bias current legs for controlling the frequency of oscillation that are switched without frequency spiking, according to a specific example embodiment of this disclosure.

Referring to FIG. 2, depicted is a schematic functional diagram of an oscillator having switched bias current legs for controlling the frequency of oscillation substantially without frequency spiking, according to a specific example embodiment of this disclosure. An oscillator, generally represented by the numeral 200, may comprise a current controlled frequency oscillator circuit 102, a plurality of bias current sources 110, 112, 114 and 116, and a plurality of first switches 220a, 222a, 224a and 226a. The current controlled frequency oscillator circuit 102 may produce a clock output 104. The frequency of oscillation (e.g., frequency of the clock output 104) of the oscillator 200 may be determined by the amount of current applied to the current controlled frequency oscillator circuit 102 from any one or combination of the bias current sources 110, 112, 114 and/or 116. The first switches, e.g., MOSFET switches, 220a, 222a, 224a and 226a may connect/disconnect the bias current sources 110, 112, 114 and 116, respectively, to/from the current controlled frequency oscillator circuit 102.

A buffer amplifier 252 has an input coupled to node 150 and an output coupled to a plurality of second switches 220b, 222b, 224b and 226b. The plurality of first switches 220a, 222a, 224a and 226a are paired with associated ones of the plurality of second switches 220b, 222b, 224b and 226b, respectively. In normal steady state operation, each pair of the plurality of first and second switches are open and closed, e.g., a first switch is open and a second switch is closed, or visa-versa. During transitions of the switch pairs both first and second switch pairs may be temporarily open or closed, e.g., make-before-break or break-before-make. As more fully described herein, substantially no current spike will be produced during switching transitions of the switch pairs.

Each of the bias current sources 110, 112, 114 and 116 may have associated parasitic capacitors 130, 132, 134 and 136, respectively, created from, for example, the gate-drain capacitance of each transistor making up a respective bias current source. Any one or more of these parasitic capacitors 130, 132, 134 and 136 may be coupled to an output of the buffer amplifier 252 through switches 220*b*, 222*b*, 224*b* and 226*b*, respectively, when not coupled to node 150 through switches 220*a*, 222*a*, 224*a* and 226*a*, respectively. Each of the switch pairs 220, 222, 224 and 226 has one switch closed and the other switch open, e.g., switch pair 220*a* and 220*b* will be on and off, respectively, or off and on, respectively. The switch pairs 220, 222, 224 and 226 may be operable in binary combinations, e.g., four switch pairs and four bias current sources may be used to control up to 16 different frequencies.

The input of the buffer amplifier 252 is coupled to node 150 such that the output of the buffer amplifier 252 is at substantially the same voltage as the voltage at node 150, e.g., the buffer amplifier 252 may be configured as a non-inverting amplifier having a gain of one (1). Since the output of the buffer amplifier 252 has fairly low impedance, the voltage on any one of the parasitic capacitors 130, 132, 134 and/or 136 will be at substantially the same voltage as the voltage at node 150. Thus, whenever one or more of the switches 220*a*, 222*a*, 224*a* and/or 226*a* close, there is substantially no voltage difference between sides of the switches 220*a*, 222*a*, 224*a* and/or 226*a* that are about to close. Since there is substantially no difference in voltage potential on either side of the switch that closes, no current spike will be generated that may create a frequency glitch when switching between the normally selected frequencies of the oscillator 200 during frequency dithering.

It is contemplated and within the scope of this disclosure that two or more current sources and switch pairs may be utilized as described herein for substantially glitch free frequency dithering.

Figure 3:
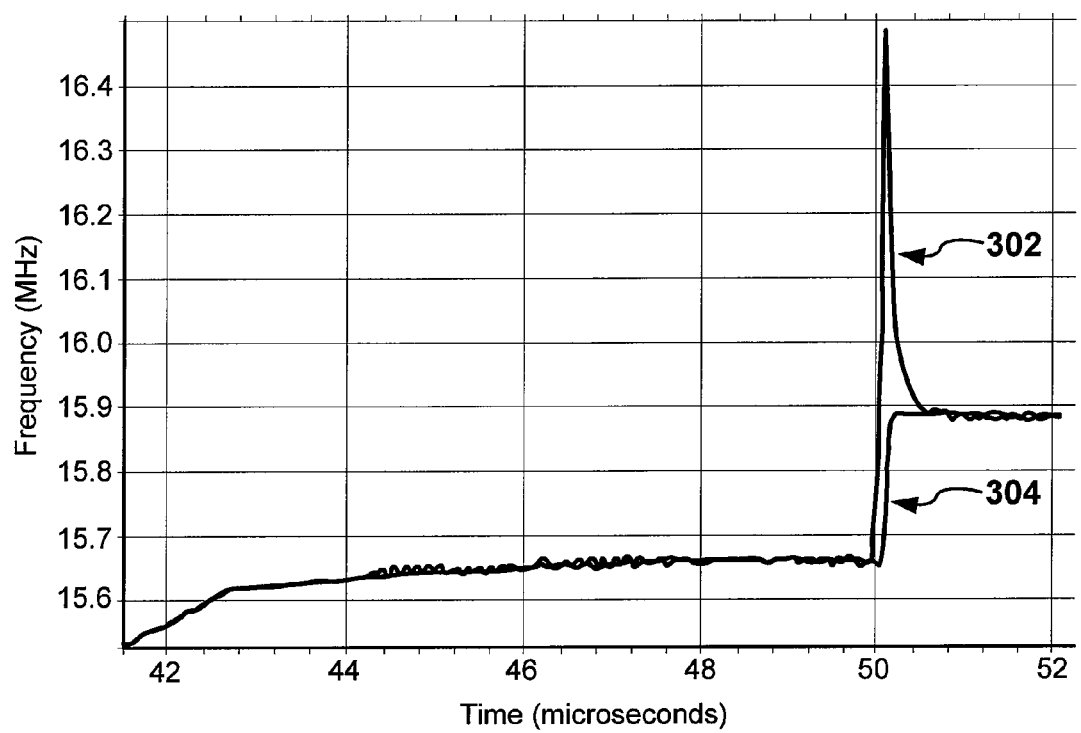
FIG. 3 illustrates graphical simulations of RC oscillator frequency switching having undesirable frequency spiking, and RC oscillator frequency switching having substantially no frequency spiking, according to a specific example embodiment of this disclosure.

Referring to FIG. 3, depicted are graphical representations of simulations of RC oscillator frequency switching having undesirable frequency spiking, i.e., curve 302, and RC oscillator frequency switching having substantially no frequency spiking, i.e., curve 304, according to a specific example embodiment of this disclosure. When using the circuit of FIG. 1, the frequency is dithered by stepping about 200 kHz and the output overshoots to about 600 kHz before settling to the final frequency value. When using the circuit of FIG. 2, smooth transitions of frequency steps are achieved without undesirable frequency overshoot.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A current controlled variable frequency oscillator, comprising:
   an oscillator having a frequency determining circuit that changes frequency with changes in current thereto;
   a plurality of current sources;
   a plurality of first switches, each of the plurality of first switching when selected couples a respective one of the plurality of current sources to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto;
   a plurality of second switches; and
   a buffer amplifier connected as a non-inverting amplifier and having a gain of substantially one, wherein an input of the buffer amplifier is coupled to the frequency determining circuit of the oscillator, and an output of the buffer amplifier is coupled to the plurality of second switches;
   wherein each of the plurality of second switches is coupled to a respective one of the current sources and couples the output of the buffer amplifier to the respective current source when the respective current source is not coupled to the frequency determining circuit of the oscillator through a respective selected one of the plurality of first switches such that each one of the plurality of current sources is at substantially the same voltage level as the frequency determining circuit.

2. The current controlled variable frequency oscillator according to claim 1, wherein the plurality of current sources are binary weighted so that there are $2^N$ selectable frequencies, where N is the number of the plurality of current sources.

3. The current controlled variable frequency oscillator according to claim 1, wherein the plurality of first and second switches are comprised of metal oxide semiconductor field effect transistors (MOSFETs).

4. The current controlled variable frequency oscillator according to claim 1, wherein the oscillator has an output used for a clock signal.

5. The current controlled variable frequency oscillator according to claim 1, wherein when a one of the plurality of first switches is selected a respective one of the plurality of second switches is deselected.

6. The current controlled variable frequency oscillator according to claim 1, wherein when a one of the plurality of first switches is deselected a respective one of the plurality of second switches is selected.

7. The current controlled variable frequency oscillator according to claim 1, wherein oscillator, the plurality of first and second switches and the buffer amplifier are fabricated on an integrated circuit.

8. A method of controlling a variable frequency oscillator, said method comprising the steps of:
   generating a clock signal with an oscillator having a frequency determining circuit controlled by an amount of current coupled thereto;
   providing a plurality of current sources, each of the plurality of current sources is adapted to supply a respective amount of current;
   providing a plurality of first switches, wherein when each of the plurality of first switching is selected a respective one of the plurality of current sources is coupled to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto;
   providing a plurality of second switches; and
   providing a buffer amplifier connected as a non-inverting amplifier and having a gain of substantially one;

coupling an input of the buffer amplifier to the frequency determining circuit of the oscillator; and coupling an output of the buffer amplifier to the plurality of second switches, wherein each of the plurality of second switches couples a respective one of the current sources to the output of the buffer amplifier when the respective current source is not coupled to the frequency determining circuit of the oscillator through a respective selected one of the plurality of first switches such that each one of the plurality of current sources is at substantially the same voltage level as the frequency determining circuit.

9. The method according to claim 8, wherein the plurality of current sources are binary weighted so that there are $2^N$ selectable frequencies, where N is the number of the plurality of current sources.

10. The method according to claim 8, further comprising the step of providing an output of the oscillator for a clock signal.

11. The method according to claim 8, wherein when a one of the plurality of first switches is selected a respective one of the plurality of second switches is deselected.

12. The method according to claim 8, wherein when a one of the plurality of first switches is deselected a respective one of the plurality of second switches is selected.

13. A digital system having a current controlled variable frequency clock oscillator, said digital system comprising:

a digital device having a clock input;

an oscillator having a frequency determining circuit that changes frequency with changes in current thereto, and an output coupled to the clock input of the digital device;

a plurality of current sources;

a plurality of first switches, each of the plurality of first switching when selected couples a respective one of the plurality of current sources to the frequency determining circuit of the oscillator, and when deselected decouples the respective one of the plurality of current sources from the frequency determining circuit of the oscillator, wherein the frequency determining circuit changes frequency based upon which ones of the plurality of current sources are coupled thereto;

a plurality of second switches; and a buffer amplifier connected as a non-inverting amplifier and having a gain of substantially one, wherein an input of the buffer amplifier is coupled to the frequency determining circuit of the oscillator, and an output of the buffer amplifier is coupled to the plurality of second switches;

wherein each of the plurality of second switches is coupled to a respective one of the current sources and couples the output of the buffer amplifier to the respective current source when the respective current source is not coupled to the frequency determining circuit of the oscillator through a respective selected one of the plurality of first switches such that each one of the plurality of current sources is at substantially the same voltage level as the frequency determining circuit.

14. The digital system according to claim 13, wherein the digital device is selected from the group consisting of a microprocessor, a microcontroller, a pulse width modulation (PWM) controller, a digital signal processor (DSP), an application specific integrated circuit (ASIC) and a programmable logic array (PLA).

15. The digital system according to claim 13, wherein the digital device, the oscillator having the frequency determining circuit that changes frequency with changes in current thereto, the plurality of current sources, the plurality of first switches, the plurality of second switches, and the buffer amplifier are fabricated in an integrated circuit.

16. The digital system according to claim 13, wherein the plurality of current sources are binary weighted so that there are $2^N$ selectable frequencies, where N is the number of the plurality of current sources.

17. The digital system according to claim 13, wherein when a one of the plurality of first switches is selected a respective one of the plurality of second switches is deselected.

18. The digital system according to claim 13, wherein when a one of the plurality of first switches is deselected a respective one of the plurality of second switches is selected.

* * * * *